United States Patent
Nishimura

(10) Patent No.: US 7,065,460 B2
(45) Date of Patent: Jun. 20, 2006

(54) APPARATUS AND METHOD FOR INSPECTING SEMICONDUCTOR DEVICE

(75) Inventor: Satoru Nishimura, Nagaokakyo (JP)

(73) Assignee: Matsushita Electric Industrial Co., Inc., Osaka (JP)

( * ) Notice: Subject to any disclaimer, the term of this patent is extended or adjusted under 35 U.S.C. 154(b) by 0 days.

(21) Appl. No.: 10/941,930

(22) Filed: Sep. 16, 2004

(65) Prior Publication Data

US 2005/0071101 A1    Mar. 31, 2005

(30) Foreign Application Priority Data

Sep. 30, 2003  (JP) .............................. 2003-338942

(51) Int. Cl.
*G01N 37/00* (2006.01)
*G06F 19/00* (2006.01)

(52) U.S. Cl. .................. 702/81; 700/108; 700/109; 700/110; 700/111

(58) Field of Classification Search ................ None
See application file for complete search history.

(56) References Cited

U.S. PATENT DOCUMENTS

| | | | |
|---|---|---|---|
| 6,911,350 B1* | 6/2005 | Tsidilkovski et al. | 438/17 |
| 2004/0057611 A1* | 3/2004 | Lee et al. | 382/145 |
| 2004/0175943 A1* | 9/2004 | Waksman | 438/689 |

FOREIGN PATENT DOCUMENTS

| | | |
|---|---|---|
| JP | 11-8327 | 1/1999 |
| JP | 11-26333 | 1/1999 |
| JP | 11-67853 | 3/1999 |
| JP | 2000-306395 | 11/2000 |
| JP | 2002-39801 | 2/2002 |
| JP | 2002-237506 | 8/2002 |

* cited by examiner

*Primary Examiner*—John Barlow
*Assistant Examiner*—Sujoy Kundo
(74) *Attorney, Agent, or Firm*—Steptoe & Johnson LLP

(57) ABSTRACT

An image of the shape of a semiconductor wafer is displayed on a display apparatus for displaying an inspection result of a semiconductor device, and a different color or pattern is displayed for each inspection result as display information indicating the inspection result of a semiconductor device in a region corresponding to the semiconductor device on the image of the semiconductor wafer.

7 Claims, 2 Drawing Sheets

F I G. 2
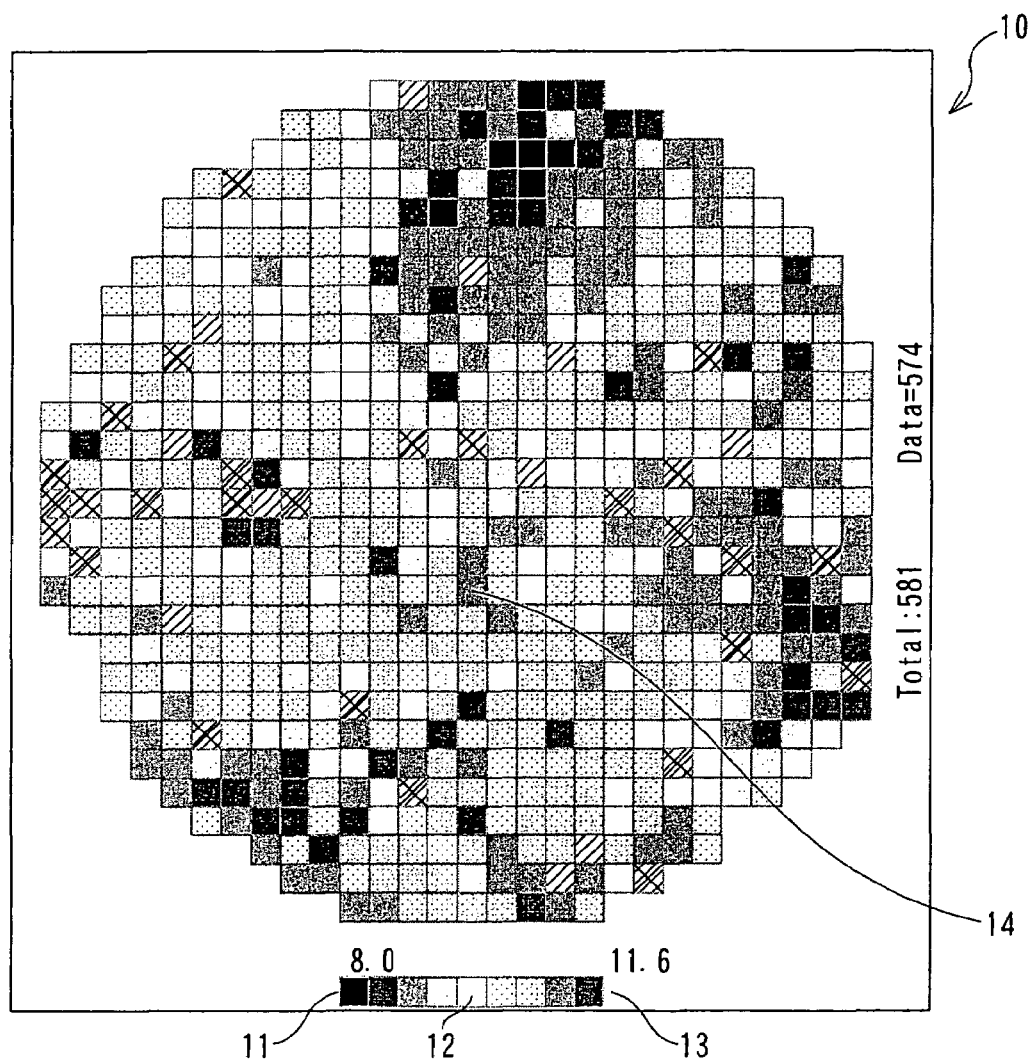

APPARATUS AND METHOD FOR INSPECTING SEMICONDUCTOR DEVICE

FIELD OF THE INVENTION

The present invention relates an apparatus and method for inspecting a semiconductor device, particularly to a technique for displaying graphically and colorfully inspection results of semiconductor devices formed on a semiconductor wafer, as a visually recognizable semiconductor wafer map.

BACKGROUND OF THE INVENTION

Generally a number of semiconductor devices are simultaneously formed on a semiconductor wafer by, for example, a technique of precisely transferring photographs. Thereafter, the semiconductor wafer is cut along scribe lines and semiconductor devices formed on the semiconductor wafer are split as semiconductor chips.

Conventional inspections conducted in a process of manufacturing the semiconductor device include, for example, inspections of electrical characteristics. Some inspections of electrical characteristics are conducted before a plurality of semiconductor devices formed on the semiconductor wafer are split into semiconductor chips, and others are conducted after the split semiconductor chips are packaged. The electrical characteristics of semiconductor devices before splitting are inspected using a so-called wafer prober and tester. The electrical characteristics of packaged semiconductor devices are inspected using a so-called handler and tester.

In the process of manufacturing semiconductor devices, it is necessary to maintain high yields in the inspections to reduce manufacturing costs. Thus, when the yields decrease, it is necessary to immediately identify the cause. This process is generally called defect analysis, which needs to be promptly performed with precision.

Semiconductor devices are broadly classified as logic circuits and analog circuits. The logic circuit mainly realizes a digital function and the input and output of the logic circuit are binary and represented as Low or High.

General defect analysis performed on the logic circuit includes a technique called "defect classification." In defect classification, a defect category is set for each defect pattern, each defect category is numbered according to inspection contents, and defects are classified into defect categories and are compiled.

Defect patterns (electrical characteristics) occurring on logic circuits are mainly caused by an open defect (a break in fine wiring in a semiconductor chip) and a short (a short circuit in fine wiring in a semiconductor chip). Hence, the cause of a defect can be tracked down with relative ease and the cause can be tracked down in the manufacturing process to a certain degree by the foregoing defect classification.

In contrast to the logic circuit, inspections on analog circuits are quite different from those of logic circuits in that a technique called a "finished quality evaluation" is used to evaluate the performance of completed semiconductor devices. This technique evaluates the performance of semiconductor devices on evaluation items such as an amplification factor, noise, and a frequency characteristic. In this technique, when a circuit completed as a semiconductor device does not reach an acceptance criteria, the semiconductor device is judged to be defective. In the following explanation, a defect judged due to insufficient performance is referred to as a "finished quality defect." The finished quality defect is a major factor responsible for reduced yields in the analog circuit.

Hence, when a semiconductor device is constituted only of analog circuits, a technique called "rank sorting" is used. In the rank sorting, regarding semiconductor devices of analog circuits, performance such as an amplification factor, noise, and frequency characteristics is measured. The semiconductor devices are classified into ranks according to the performance and are shipped for each rank.

Listed below are Japanese unexamined patent application publications available as prior art documents:
1. Japanese Patent Laid-Open No. 2000-306395
2. Japanese Patent Laid-Open No. 11-8327
3. Japanese Patent Laid-Open No. 11-26333

However, semiconductor devices in large scale integration and one-chip configurations have been developed in recent years. The one-chip configuration includes a digital semiconductor and an analog semiconductor as a single semiconductor device unlike the conventional art, in which a digital semiconductor and an analog semiconductor are combined with each other. Thus, the one-chip configuration has a digital circuit and an analog circuit on the same semiconductor device.

Particularly due to the recent development of digital products, an analog circuit is frequently integrated into a semiconductor device of a digital circuit. In this case, it is difficult to measure the performance of the analog circuit alone and thus rank sorting cannot be performed in the above manner before shipping. Further, even when a digital circuit is acceptable, an analog circuit evaluated as a "finished quality defect" results in a defective semiconductor device, thereby reducing yields. For this reason, it is necessary to reduce a performance error required for analog circuits in order to increase yields.

Unlike the digital circuit, the analog circuit has an input and output of linear values and thus when "defect classification" used for defect analysis of the digital circuit is used for defect analysis on a semiconductor device including both of a digital circuit and an analog circuit, the following problems arise:

First, it is not possible to read the measurement values of electrical characteristics in the analog circuit. Generally inspections on linear values have inspection specifications of a lower limit specification, a central specification, and an upper limit specification. An inspection result is obtained by deciding a specification corresponding to a measurement value. However, when measurement values cannot be read, it is not possible to recognize whether the performance of the analog circuit is deviated to the lower limit or the upper limit.

Second, since measurement values cannot be read during inspection, when a defect is found in inspection results, it is not possible to recognize how far the measurement value is deviated from the inspection specifications. Thus, it is not possible to distinguish, from inspection results, whether the defect is a finished quality defect or an open defect or short circuit.

Further, the following is known: in inspections on electrical characteristics, electrical characteristics vary from position to position in the plane of a semiconductor wafer in some cases, causing variations in measurement value. However, it is not possible to read from defect categories what electrical characteristics are obtained on which position in the plane of the semiconductor wafer, that is, variations in electrical characteristics in the plane of the wafer.

For example, after semiconductor devices on a semiconductor wafer are split into semiconductor chips, when one of the semiconductor chips is found to be a finished quality defect during inspections, the following information cannot be read: to what degree the semiconductor chip, which has been found to be a finished quality defect, is defective in terms of measurement values of inspections, and information about whether a measurement value close to the lower limit specification or the upper limit specification is actually found on a semiconductor chip around the defective semiconductor chip on the semiconductor wafer where the semiconductor chips are cut, even if a finished quality defect is not found.

Therefore, in the conventional technique, when semiconductor devices decrease in yield, it is difficult to readily recognize whether yields are accidentally reduced or signs pointing to lower yields have been already exhibited. For example, one of the signs is that a measurement value are within the inspection specifications but gradually comes closer to the lower limit specification or the upper limit specification.

Further, inspections on electrical characteristics generally have several tens to hundreds inspection items and several tens to hundreds semiconductor devices are formed on a semiconductor wafer. Thus, the number of inspection items multiplied by the number of semiconductor devices makes an enormous amount of data which is collected as inspection results of electrical characteristics.

For this reason, when the inspection results on electrical characteristics are displayed simply as numeric data, it is difficult for an evaluator to use the data for defect analysis. When result values indicating inspection results are collected but position information, which indicates where a semiconductor device to be inspected is disposed in the plane of a semiconductor wafer, is hard to understand, the evaluator cannot readily perform defect analysis. Moreover, it is not possible to recognize the distribution tendency of electrical characteristics in a semiconductor wafer before splitting.

Hence, a defect analysis system is demanded which simultaneously displays position information on semiconductor devices in the plane of a semiconductor wafer and result values indicating the inspection results of finished quality evaluations to communicate the inspection results clearly to the evaluator who performs defect analysis. Further, instead of defect classification (defect category data), defect analysis according to the measurement values of electrical characteristics is necessary to confirm finished quality.

DISCLOSURE OF THE INVENTION

The present invention is devised to solve the problems, and has an object to provide an apparatus and method for inspecting a semiconductor device whereby a number of inspection results can be clearly represented for an engineer by graphics display and color (gradation) display.

In order to attain the object, the apparatus for inspecting a semiconductor device according to the present invention comprises an apparatus for identifying a semiconductor wafer and an in-plane position of the semiconductor device in the semiconductor wafer, an apparatus for inspecting electrical characteristics of the semiconductor device, an apparatus for storing inspection result information of the electrical characteristics, an inspection result processor for converting the inspection result information into display information, and a display apparatus for displaying the display information, wherein the display apparatus displays an image of the shape of the semiconductor wafer, and displays, as the display information indicating an inspection result of the semiconductor device, a different color or pattern for each inspection result in a region corresponding to the semiconductor device on the image of the semiconductor wafer.

With this configuration, the display apparatus, for example, a full-color graphics display apparatus displays the inspection results on the electrical characteristics of the semiconductor devices with different colors (gradations) according to the values of the inspection results, or displays the inspection results with different patterns according to the values of the inspection results.

It is thus possible to clearly represent to an evaluator significant items for the inspections of analog circuits, that is, variations in electrical characteristics on respective positions in the plane of the wafer and the tendency (distribution) of variations in electrical characteristics in the plane of the wafer. Moreover, it is possible to clearly and precisely provide the evaluator with information required for defect analysis not being performed in the conventional art, that is, information for tracking down the cause of a finished quality defect resulting in lower yields.

In this way, the cause of a finished quality defect specific to an analog circuit is clearly communicated to the evaluator, which has been difficult in the conventional art, and the evaluator can promptly perform defect analysis to find a process causing the defect. Consequently, the costs of semiconductor products can be reduced.

The method for inspecting a semiconductor device according to the present invention is for displaying inspection result information about the electrical characteristics of the semiconductor device on a semiconductor wafer, the method comprising the steps of displaying an image of the shape of the semiconductor wafer, and displaying, as display information indicating an inspection result of the semiconductor device, a different color or pattern for each inspection result in a region corresponding to the semiconductor device on the image of the semiconductor wafer.

BRIEF DESCRIPTION OF THE DRAWINGS

FIG. 2 is a diagram showing an example of the inspection results actually displayed in color in the configuration of FIG. 1.

DESCRIPTION OF THE EMBODIMENT

Figure 1:
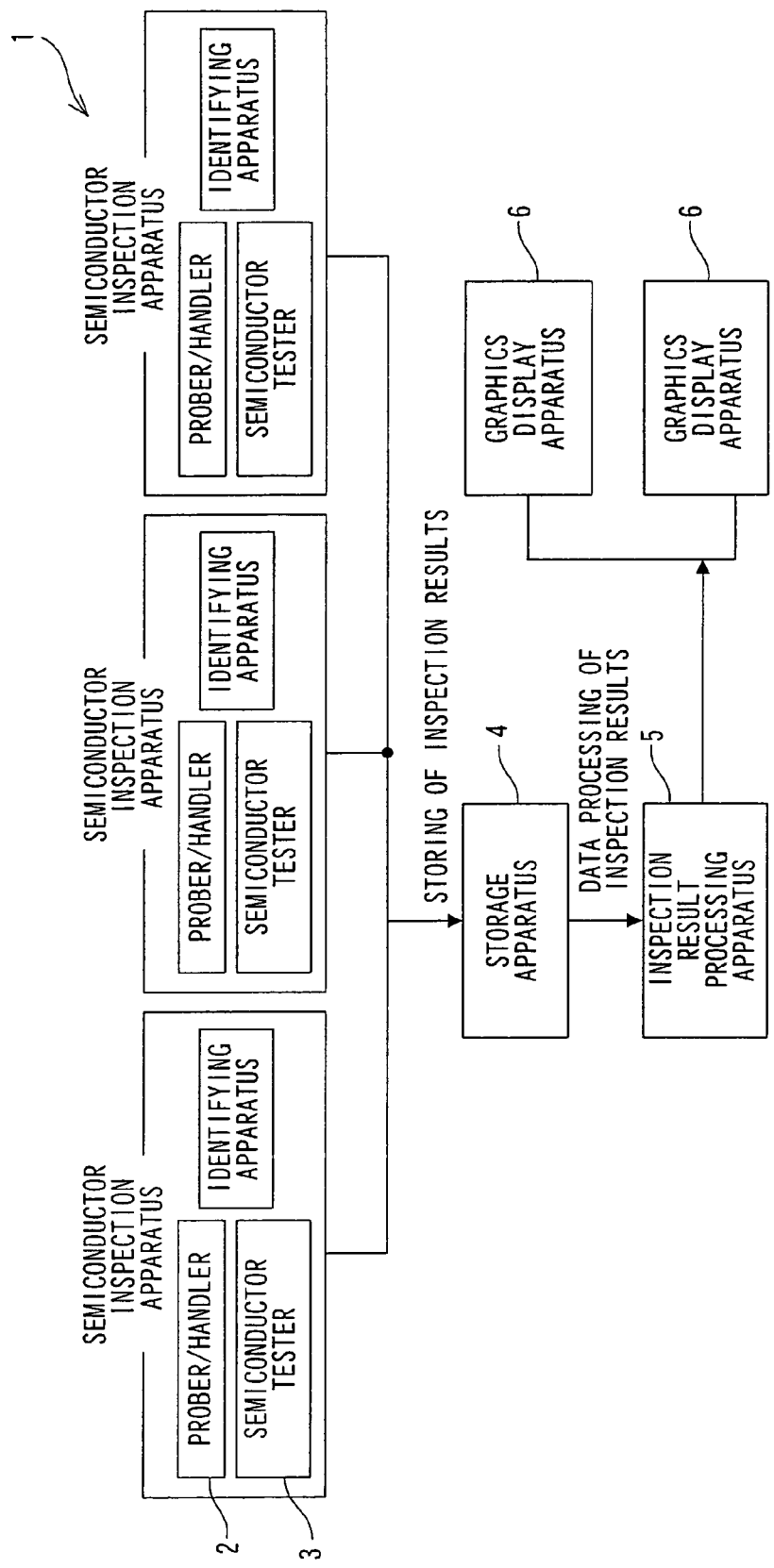
FIG. 1 is a structural diagram showing a semiconductor inspection apparatus and a system for displaying inspection results in color according to an embodiment of the present invention.

An embodiment of the present invention will be described below in accordance with the accompanying drawings. FIG. 1 is a schematic diagram showing the configuration of the present invention. A semiconductor inspection apparatus 1 comprises a so-called wafer prober or a handler 2. Generally a prober is used before a semiconductor wafer is split, and a handler is used after a semiconductor wafer is split (after packaging and sealing). A semiconductor tester 3 is a machine for inspecting electrical characteristics of a semiconductor product. Various kinds of semiconductor testers are available.

In order to use the semiconductor inspection apparatus 1 and the semiconductor tester 3 in the present invention, it is necessary to transmit inspection results on electrical characteristics to a host computer and the like via a communication line. The semiconductor tester 3 in recent years can transmit inspection results via a communication line in most cases.

The prober 2 which serves as a carrier also has the function of transmitting wafer information and wafer in-plane information via a communication line. The wafer information concerns a semiconductor wafer to be measured, and the wafer in-plane information is position information on a semiconductor device (semiconductor chip) in the plane of a wafer. For convenience of illustration, an apparatus for identifying a semiconductor wafer and the in-plane position of a semiconductor device in the semiconductor wafer is shown separately from the prober 2 in FIG. 1.

Generally the current semiconductor inspection apparatus 1 is configured so that the handler 2 and the semiconductor tester 3 are electrically connected to each other. The semiconductor tester 3 has the function of transmitting result values, which indicate the inspection results on electrical characteristics, the wafer information, and the wafer in-plane information in associated in one another to a host computer, etc. via a communication line.

When a semiconductor inspection is conducted after a semiconductor wafer is split (after packaging and sealing), the handler 2 needs to recognize the wafer information and the wafer in-plane information in a similar manner. Regarding this system, several techniques are known (references: Japanese Patent Laid-Open No. 11-8327, Japanese Patent Laid-Open No. 11-26333). Hence, the detail of these systems will not be discussed in the present invention. The present invention can obtain the wafer information and the wafer in-plane information also in semiconductor inspections performed with the handler 2 after splitting a semiconductor wafer.

The wafer information transmitted from the semiconductor inspection apparatus 1, the wafer in-plane information, and inspection result information which includes result values indicating inspection results are stored at any time in an apparatus 4 for storing inspection results. Various kinds of the inspection result storage apparatus 4 are available. In the present embodiment, the apparatus 4 can store the wafer information, the wafer in-plane information, and the inspection result information at any time in a so-called database and readily retrieve the information.

Various kinds of a graphics display apparatus 6 are available. In the present embodiment, a personal computer is used which is equipped with a widely used Internet web browser. An inspection result processor 5 constituted of software needs to have a function associated with the Internet web browser and thus so-called web server software is used. The inspection result processor 5 converts the inspection result information, which has been stored in the apparatus 4 for storing inspection results, into display information having a different color or pattern for each of the inspection results.

An object of the present invention is to conduct inspections of several tens to hundreds inspection items on several tens to hundreds semiconductor devices (semiconductor chips) formed on a semiconductor wafer, clearly represent to an engineer the inspection results on a number of electrical characteristics obtained from the semiconductor devices, and perform defect analysis with ease.

In order to attain the object, the graphics display apparatus 6 displays inspection results on each of the inspection items for each semiconductor wafer on one screen. The graphics display apparatus 6 displays an image of the shape of a semiconductor wafer, displays display information, which indicates an inspection result on each semiconductor device, in a region corresponding to the semiconductor device on the image of the semiconductor wafer, and displays a different color or pattern for each inspection result as display information.

FIG. 2 shows an example of a display result of the present embodiment. A result display screen 10 is colored in actual display. FIG. 2 schematically shows a color difference as a pattern difference. As shown in FIG. 2, the display information can be displayed with different patterns.

As a result, the inspection results on electrical characteristics of semiconductor devices can be so displayed that the actual position of each semiconductor device can be recognized in the semiconductor wafer. Thus, it is possible to readily evaluate variations (unevenness) in the electrical characteristics of the semiconductor wafer in the plane of the wafer.

The relationship between colors and result values indicating inspection results on electrical characteristics is determined beforehand. The relationship is determined by matching a result value with a tone of color. For example, 30 levels of gray are set between blue and red as color tones, and 30 divisions are made between the upper limit value and the lower limit value of the result values. The lower limit of the result values is matched with a blue tone and the upper limit of the result values is matched with a red tone. A target result value is matched with a white tone which is a halftone for blue and red, and the result values are allocated to other tones, respectively.

In general process control, quality control is so performed as to have a result value at the median of inspection specifications. Hence, when result values are displayed in colors in the present embodiment, the median of the inspection specifications is matched with white. Further, the shape of the semiconductor wafer is basically displayed in white on the result display screen 10 of the graphics display apparatus 6.

In the example of FIG. 2, the relationship between the result values and colors is indicated in the lower part of the result display screen 10. In this case, as to the inspection specifications of electrical characteristics, the target value is 9.8, the lower limit value is 8.0, and the upper limit value is 11.6. The lower limit value of 8.0 corresponds to a blue tone (reference numeral 11), the target value of 9.8 corresponds to a white tone (reference numeral 12), and the upper limit value of 11.6 corresponds to a red tone (reference numeral 13).

Thus, when a measurement value of an electrical characteristic of a semiconductor device, that is, a result value of an inspection result is equal to the target value of 9.8 in the inspection, the numeric data of the result value of 9.8 is displayed as a white tone (reference numeral 12) in the actual graphics screen.

As a result value is varied (changed) to the lower limit value of 8.0, an actual graphics screen displays colors in stages from a white tone (reference numeral 12) to a blue tone (reference numeral 11).

Similarly as a result value is varied to the upper limit value of 11.6, the actual graphics screen displays colors in stages from a white tone (reference numeral 12) to a red tone (reference numeral 13).

When the result value of an inspection result is the median of inspection specifications regarding the electrical characteristics of each semiconductor device, a region corresponding to the semiconductor device is displayed in white on the image of the semiconductor wafer. Alternatively, as a result value comes closer to the lower limit, a region corresponding to the semiconductor device is displayed in blue. Conversely, when an inspection result value comes closer to the upper limit, a region corresponding to the semiconductor device is displayed in red. Therefore, an evaluator who performs defect analysis can recognize variations in the electrical characteristics of the semiconductor wafer at a glance.

When an inspection value varies from position to position in the plane of the wafer, the actual graphics screen has a tone deviated from the median of the inspection specifications, that is, a blue tone or a red tone. By taking a look at a specific tone of color to recognize the distribution of the color and changes in tone, it is possible to recognize at a glance variations in the result values of inspection results on electrical characteristics.

In the conventional analysis using a so-called defect category, the shape of a semiconductor wafer is displayed on the screen of a graphics display apparatus and a defect category number is displayed on a region corresponding to a semiconductor device. In this method using a defect category, only when a result value is deviated from inspection specifications, a defect category number is displayed.

The present invention makes it possible to positively and clearly communicate the distribution and tendency of result values in the plane of a wafer.

For example, in the result display screen 10 of FIG. 2, when a highly colored portion (displayed in blue on an actual screen) 14 is present only at the center of the screen, the following is presumed: in a process of manufacturing a semiconductor wafer, a defect is caused by a scrubber which is an apparatus for cleaning a semiconductor wafer with high-pressure stream of water.

When the result display screen 10 has variations at and around the center of the semiconductor wafer and the variations are shaped like concentric circles, the following is presumed: of facilities used in the process of manufacturing a semiconductor wafer, a facility for a darkroom process (exposing process), in which the semiconductor wafer is rotated, causes a defect.

Further, when the result display screen 10 has variations in a radial manner, the following is presumed: of facilities used in the process of manufacturing a semiconductor wafer, a facility for a darkroom process (a process of applying a resist) causes a defect. In this process, the semiconductor wafer is rotated, a liquid resist is dropped to the center of the wafer, and the resist is distributed over the semiconductor wafer.

Moreover, when the result display screen 10 has variations in a lattice pattern, the following is presumed: of facilities used in the process of manufacturing a semiconductor wafer, a stepper causes a defect. The stepper forms a circuit pattern on the semiconductor wafer by using photography.

Besides, when the result display screen 10 has variations at random, the following is presumed: in the process of manufacturing a semiconductor wafer, a defect is caused by dust in the air that adheres to the semiconductor wafer.

Incidentally, various kinds of facilities are used in the process of manufacturing a semiconductor wafer. For example, a facility for processing wafers one by one, a facility for processing two or three wafers at a time, and a facility for processing 25 to 50 wafers at a time are available.

By displaying the inspection results of two or more semiconductor wafers in graphics and comparing the results at the same time, it is possible to identify which facility causes a defect. In the embodiment of the present invention, a personal computer equipped with a web browser is used as the graphics display apparatus. Thus, when the inspection results of two or more semiconductor wafers are displayed, a plurality of inspection results are displayed by the web browser, so that the inspection results can be readily compared with one another.

For example, when the inspection results of adjacent semiconductor wafers in the same lot are displayed with completely different color patterns, the following is presumed: of facilities used in the process of manufacturing a semiconductor wafer (diffusing process), a facility for processing semiconductor wafers one by one causes a defect.

When the same variation pattern is found every specific number of wafers, e.g., every three or five wafers, a facility causing a defect can be identified by looking for a process of processing three or five wafers at a time.

For example, an epitaxial apparatus processes three to ten semiconductor wafers at a time and the electrical characteristics of the semiconductor wafer are changed according to a position where the semiconductor wafer is set in the epitaxial apparatus.

In an annealing process, a plurality of semiconductor wafers are raised in a glass tube and processing is performed. The semiconductor wafers have different electrical characteristics between the front and back of the glass tube.

Further, the relationship between the inspection items and the steps of the manufacturing process (diffusing process) is understood. Thus, when variations are recognized on the result display screen during an inspection on an inspection item, the process associated with the inspection item is presumed to cause a defect. That is, it is possible to track down the relationship between the inspection item and the process causing a defect.

In addition, by tracking down the relationship between a variation pattern and a temperature or a humidity as an empirical rule, the cause of a defect can be analyzed.

According to the present invention, color display (gradation display) is provided in graphics display, so that inspection result values can be communicated to an evaluator with a simple method, defect analysis can be quickly performed to track down the cause of a defect (finished quality defect) specific to an analog circuit, and thus the present invention can be used for a system of manufacturing a semiconductor device.

What is claimed is:

1. A semiconductor device inspecting apparatus, comprising:
   an apparatus for identifying a semiconductor wafer and an in-plane position of a semiconductor device in a semiconductor wafer that comprises a plurality of semiconductor devices including an analog circuit,
   an apparatus for inspecting an electrical characteristic of such a semiconductor device by inputting a linear value to each of such a plurality of semiconductor devices,
   an apparatus for storing inspection result information of the linear value of such an electrical characteristic,
   an inspection result processor for converting inspection result information into display information, and
   a display apparatus for displaying display information, wherein
   the display apparatus is for displaying (1) an image of a shape of a semiconductor wafer, and (2) a different color or pattern for each inspection result information of the linear value in a region corresponding to a semiconductor device on the image of a semiconductor wafer as display information indicating an inspection result of such semiconductor device.

2. A semiconductor device inspecting method for displaying inspection result information about an electrical characteristic of a semiconductor device on a semiconductor wafer that comprises a plurality of semiconductor devices including an analog circuit, the method comprising:

inputting a linear value to each of such a plurality of semiconductor devices and inspecting the electrical characteristic thereof, displaying an image of a shape of a semiconductor wafer, and displaying, as display information indicating an inspection result of a semiconductor device, a different color or pattern for each inspection result information of the linear value in a region corresponding to a semiconductor device on an image of such a semiconductor wafer.

3. The semiconductor device inspecting apparatus according to claim 1, wherein the display apparatus comprises a personal computer comprising an Internet web browser, and the inspection result processor comprises web server software for converting inspection result information into display information that can be browsed by the Internet web browser.

4. The semiconductor device inspecting apparatus according to claim 1, wherein the display apparatus is for displaying on one screen, inspection result information for each of a plurality of semiconductor wafers and each inspection item.

5. The semiconductor device inspecting apparatus according to claim 1, wherein the display apparatus is for displaying at the same time on one screen, inspection results for a plurality of semiconductor wafers.

6. The semiconductor device inspecting apparatus according to claim 1, wherein when inspection result information is converted into display information, the inspection result processor is for (1) making divisions between an upper limit value and a lower limit value of result values included in the inspection result information, said divisions being a plurality of distribution ranges, (2) setting a plurality of levels of gray between blue and red as color tones, the colors being indicated as display information, and (3) matching each result value with each color tone.

7. The semiconductor device inspecting apparatus according to claim 6, wherein the inspection result processor is for matching a target value among result values with a tone of white as a halftone for blue and red, and for matching of other result values with each of other tones respectively.

* * * * *